(12) United States Patent
Yasutake

(10) Patent No.: US 7,372,099 B2
(45) Date of Patent: May 13, 2008

(54) SEMICONDUCTOR DEVICE AND ITS MANUFACTURING METHOD

(75) Inventor: Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/199,380

(22) Filed: Aug. 9, 2005

(65) Prior Publication Data
US 2006/0270133 A1 Nov. 30, 2006

(30) Foreign Application Priority Data
May 26, 2005 (JP) ............... 2005-153948

(51) Int. Cl.
*H01L 29/76* (2006.01)
(52) U.S. Cl. ..................... 257/327; 438/199
(58) Field of Classification Search ............... 257/327, 257/344, 408, 623, E21.438, E21.626, E21.64, 257/E29.267, 199, 301, 289–291, 303, 649, 257/305–307
See application file for complete search history.

(56) References Cited

U.S. PATENT DOCUMENTS 6,365,468 B1   4/2002   Yeh et al.

7,078,285 B1 * 7/2006 Suenaga ..................... 438/199

FOREIGN PATENT DOCUMENTS

JP        08-186257 A      7/1996

OTHER PUBLICATIONS

P.R. Chidambaram et al., "35% Drive Current Improvement from Recessed-SiGe Drain Extensions on 37 nm Gate Length PMOS", 2004 Symposium of VLSI Technology Digest of Technical Papers, pp. 48-49.

* cited by examiner

*Primary Examiner*—David Vu
(74) *Attorney, Agent, or Firm*—Foley & Lardner LLP

(57) ABSTRACT

A semiconductor device, which can use silicon-germanium for a source/drain extension of pMOS, form a silicide layer on the source/drain, and realize a high-speed operation, is provided by comprising a gate electrode formed in a first conductive type region of a semiconductor substrate via an insulator, a first sidewall formed on a side face of the gate electrode, a second sidewall formed on a side face of the first sidewall, a semiconductor layer formed below the second sidewall, including a first impurity layer of a second conductive type and containing germanium, a second impurity layer formed in a region outside the second sidewall and containing impurities of the second conductive type with a higher concentration than those in the first impurity layer, and a silicide layer formed on the second impurity layer.

24 Claims, 7 Drawing Sheets

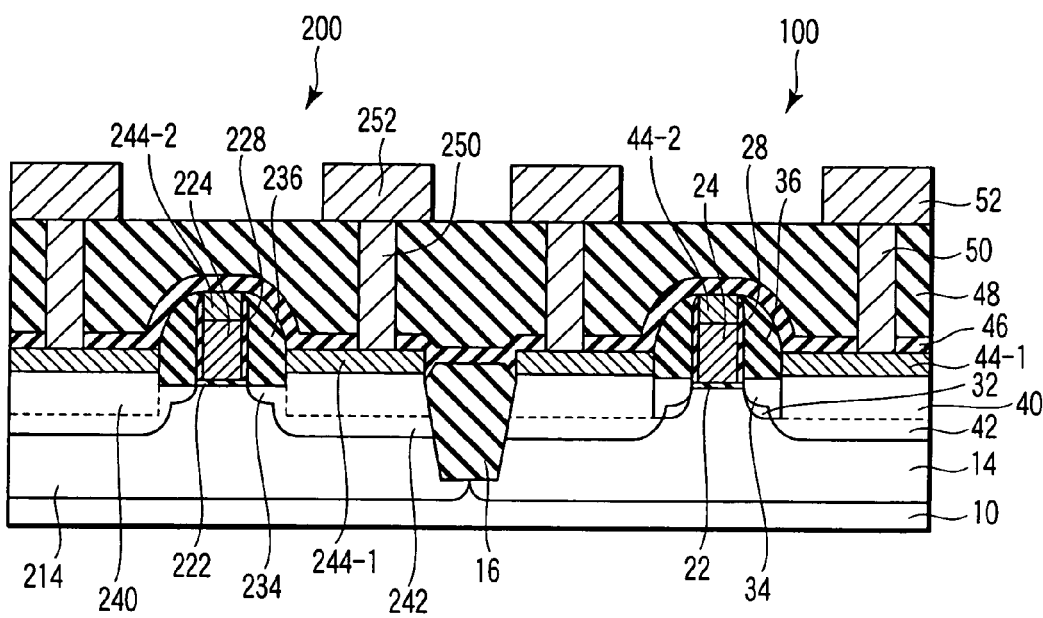
F I G. 1
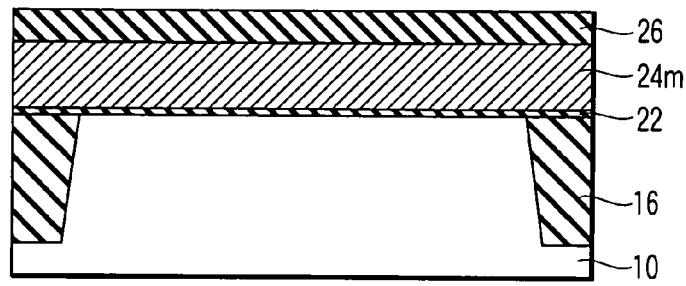
F I G. 2A
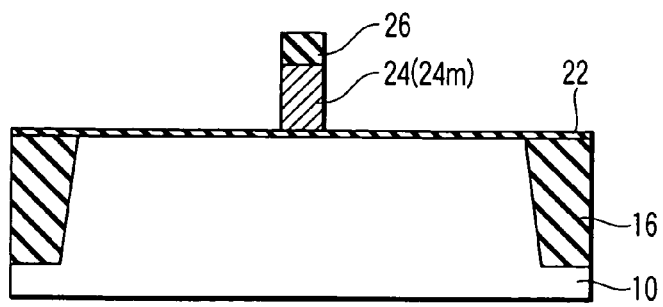
F I G. 2B

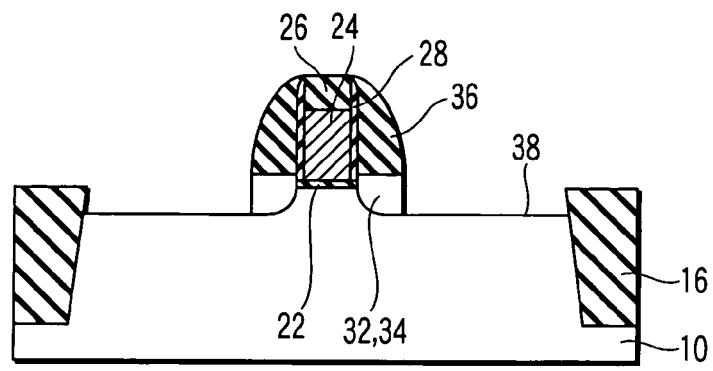
F I G. 6A
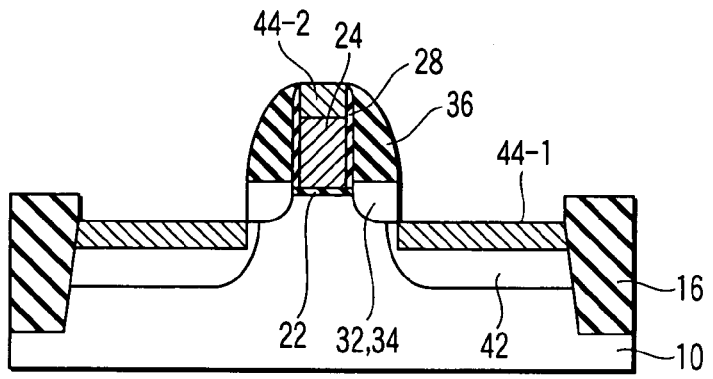
F I G. 6B
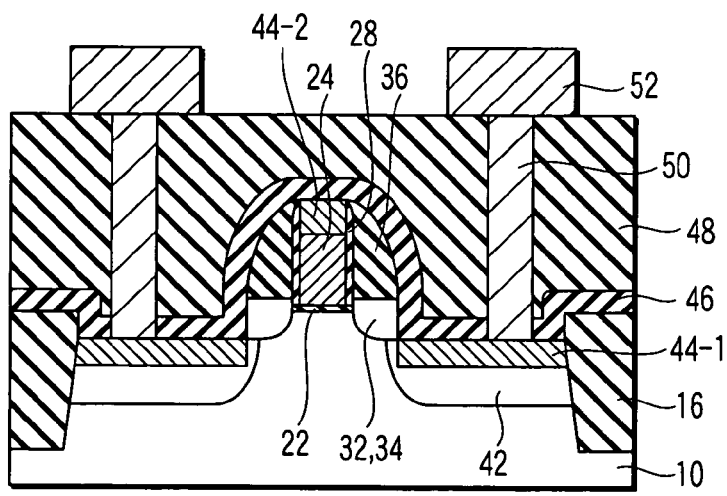
F I G. 6C

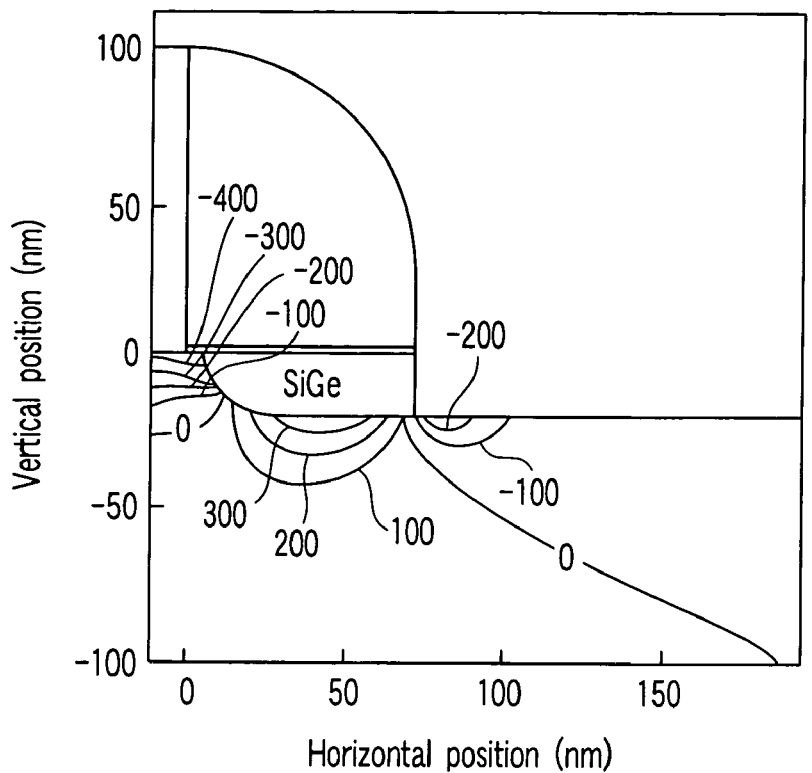
F I G. 9A
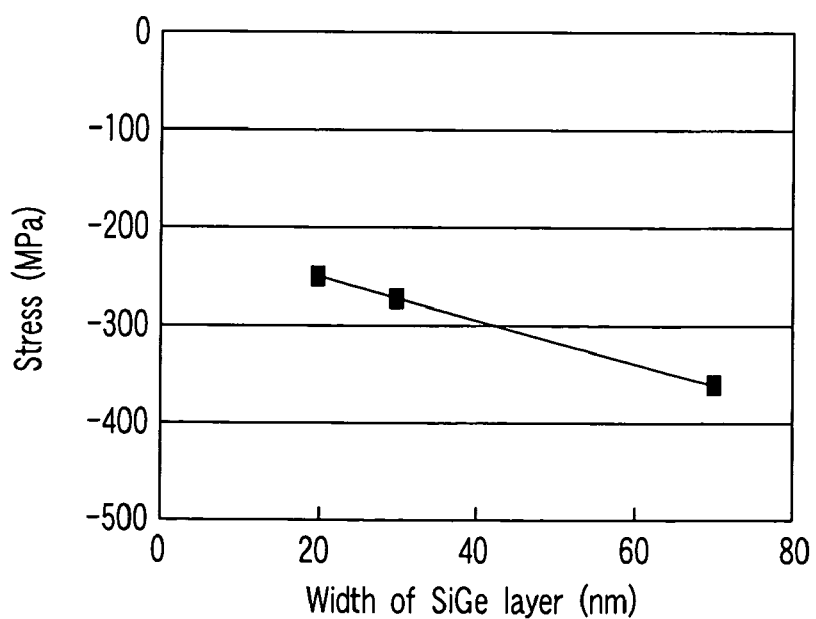
F I G. 9B

SEMICONDUCTOR DEVICE AND ITS MANUFACTURING METHOD

CROSS-REFERENCE TO RELATED APPLICATIONS

This application is based upon and claims the benefit of priority from prior Japanese Patent Application No. 2005-153948, filed May 26, 2005, the entire contents of which are incorporated herein by reference.

BACKGROUND OF THE INVENTION

1. Field of the Invention

The present invention relates to a semiconductor device and its manufacturing method, and more particularly, it relates to a semiconductor device which uses silicon germanium and its manufacturing method.

2. Description of the Related Art

Miniaturization of a semiconductor device has been accompanied by attention paid to a strained silicon device to achieve a higher speed operation in a metal oxide semiconductor (MOS) device. In a complementally MOS field effect transistor (CMOSFET) formed on silicon, since carrier (i.e., hole) mobility in a channel region of p channel MOSFET (pMOS) is lower than carrier (i.e., electron) mobility in a channel region of an n channel MOSFET (nMOS), pMOS operating in a higher speed is desired to be achieved. In the pMOS, it is known that the carrier (i.e., hole) mobility is enhanced by applying compressive stress to the channel region.

There is known a method of enhancing carrier (i.e., hole) mobility by applying compressive stress to the channel region by using a semiconductor having larger atomic radius than that of silicon, such as germanium or silicon germanium (SiGe), for a source/drain and/or source/drain extension of a silicon pMOS device (see, e.g., Jpn. Pat. Appln. KOKAI Publication No. 8-186257).

Additionally, a method of efficiently forming an SiGe layer on a drain extension and/or a drain is disclosed by P. R. Childambaram et al., in 2004 Symposium on VLSI Technology Digest of Technical Papers, pp. 48-49. According to this method, a shallow trench is formed in a silicon substrate on which a SiGe layer is selectively formed by epitaxial growth, then the drain extension and/or the drain are formed therein. Further, a silicide layer (e.g., nickel silicide layer (NiSi)) is formed on the drain of the SiGe layer.

However, if germanium is contained in the source/drain on which the silicide layer is formed, a problem of a deposition failure such as agglomeration of silicide metal (e.g., nickel) and/or peeling off of the silicide film or the like occurs during the formation of the silicide layer on the source/drain.

To solve the problem, an attempt has been made to prevent the deposition failure by epitaxially growing a silicon film on the source/drain made of SiGe, and then forming the silicide layer thereon. However, if a portion of the silicon film is not sufficiently thick, there is a possibility to cause segregation of a silicide metal (e.g., Ni) due to contacting the silicide layer with the SiGe layer.

BRIEF SUMMARY OF THE INVENTION

The problems will be solved by a semiconductor device and its manufacturing method according to the present invention described below.

According to one aspect of the present invention, it is provided a semiconductor device comprising: a gate electrode formed in a first conductive type region of a semiconductor substrate via an insulator; a first sidewall formed on a side face of the gate electrode; a second sidewall formed on a side face of the first sidewall; a semiconductor layer formed below the second sidewall, including a first impurity layer of a second conductive type and containing germanium; a second impurity layer formed in a region outside the second sidewall and containing impurities of the second conductive type with a higher concentration than those in the first impurity layer; and a silicide layer formed on the second impurity layer.

According to another aspect of the present invention, it is provided a semiconductor device comprising: first and second semiconductor elements, wherein the first semiconductor element comprises: a first gate electrode formed in a first conductive type region of a semiconductor substrate via an insulator; a first sidewall formed on a side face of the first gate electrode; a second sidewall formed on a side face of the first sidewall; a semiconductor layer formed below the second sidewall, including a first impurity layer of a second conductive type and containing germanium; a second impurity layer formed in a region outside the second sidewall and containing impurities of the second conductive type with a higher concentration than those in the first impurity layer; and a first silicide layer formed on the second impurity layer, and the second semiconductor element comprises: a second gate electrode formed in a second conductive type region of the semiconductor substrate via an insulator; a third sidewall formed on a side face of the second gate electrode; a fourth sidewall formed on a side face of the third sidewall; a third impurity layer of a first conductive type formed in the semiconductor substrate below the sidewall of the fourth sidewall; a fourth impurity layer formed in a region outside the fourth sidewall and containing impurities of a first conductive type with a higher concentration than those in the third impurity layer; and a second silicide layer formed on the fourth impurity layer.

According to still another aspect of the present invention, it is provided a method for manufacturing a semiconductor device comprising: forming a gate electrode in a first conductive type region of a semiconductor substrate via an insulator; forming a first sidewall on a side face of the gate electrode; forming a first trench in a region outside the first sidewall; forming a semiconductor layer containing germanium in the trench; doping impurities of a second conductive type to the semiconductor layer to form a first impurity layer; forming a second sidewall on a side face of the first sidewall on the semiconductor layer; removing the semiconductor layer from a region outside the second sidewall to form a second trench; doping impurities of the second conductive in a higher concentration than those in the first impurity layer to the region outside the second sidewall to form a second impurity layer; and forming a silicide layer on the second impurity layer.

According to still another aspect of the present invention, it is provided a method for manufacturing a semiconductor device comprising: forming a first gate electrode in a first conductive type region of a semiconductor substrate via an insulator and a second gate electrode in a second conductive type region of the semiconductor substrate via an insulator; forming a first sidewall on a side face of the first gate electrode and a second sidewall on a side face of the second gate electrode; forming a first trench in the semiconductor substrate in a region outside the first sidewall; forming a semiconductor layer containing germanium in the first trench; doping impurities of a second conductive type to the semiconductor layer to form a first impurity layer and impurities of a first conductive type to a region outside the second sidewall of the semiconductor substrate to form a second impurity layer; forming a third sidewall on a side face of the first sidewall on the semiconductor layer and a fourth sidewall on a side face of the second sidewall; removing the semiconductor layer from a region outside the third sidewall to form a second trench; doping impurities of the second conductive type in a higher concentration than those in the first impurity layer to the region outside the third sidewall to form a third impurity layer and impurities of the first conductive type in a higher concentration than those in the second impurity layer to a region outside the fourth sidewall to form a fourth impurity layer; and forming a first silicide layer on the third impurity layer to form a first semiconductor element and a second silicide layer on the fourth impurity layer to form a second semiconductor element.

BRIEF DESCRIPTION OF THE SEVERAL VIEWS OF THE DRAWING

FIG. 1 is a sectional view illustrating an example of a semiconductor device according to a first embodiment of the present invention;

FIGS. 2A, 2B, 2C, 2D, 2E, 2F, 2G, and 2H are process sectional views illustrating an example of a manufacturing process of a pMOS semiconductor device according to the first embodiment of the present invention;

FIGS. 6A, 6B, and 6C are process sectional views illustrating an example of a manufacturing process of a pMOS semiconductor device according to the second embodiment of the present invention;

FIGS. 9A and 9B are views illustrating results of stress simulation showing effects of the present invention.

DETAILED DESCRIPTION OF THE INVENTION

Figure 2C:
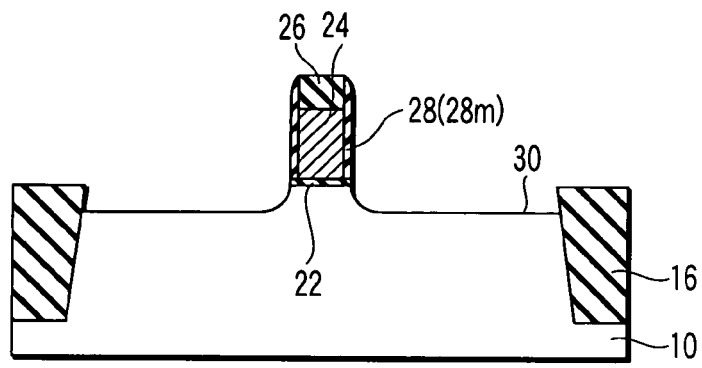

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

First Embodiment

A first embodiment of the present invention is directed to a semiconductor device in which SiGe is used for a source/drain extension of pMOS of a CMOS semiconductor device, and a source/drain and the source/drain extension are set at a higher level than that of a channel region to form an elevated structure, and its manufacturing method. The use of SiGe for the source/drain extension of pMOS enables enhanced carrier (i.e., hole) mobility in the channel of pMOS by applying compressive stress to the channel region. Further, the elevated structure of the source/drain and the source/drain extension makes effective junction depths thereof to be shallow. As a result, an operation speed of pMOS can be set higher.

FIG. 1 shows an example of a sectional structure of the semiconductor device according to the embodiment. The embodiment is a CMOS semiconductor device which comprises a pMOS 100 and an nMOS 200. Both pMOS 100 and nMOS 200 have elevated sources/drain structure in which surfaces of sources/drains 42, 242 are in a higher level than that of an original surface of a semiconductor substrate 10, e.g., a silicon substrate 10. In pMOS 100, SiGe 32 is used for a source/drain extension 34.

SiGe 32 is used only for the source/drain extension 34 of pMOS 100, but SiGe is not used for the source/drain 42. That is, in a region of pMOS where the source/drain 42 is formed, SiGe 32 is removed therefrom, and then silicon 40 of an elevated structure is formed there. Accordingly, when silicide 44 is formed on the source/drain 42, a deposition failure such as agglomeration of silicide metal (e.g., nickel) and/or peeling off of the silicide film 44 can be prevented.

In nMOS 200, a source/drain extension 234 is formed in the silicon substrate 10. However, as in the case of pMOS 100, the source/drain 242 is formed in silicon 240 of an elevated structure.

Moreover, with the aforementioned structure, i.e., the source/drain extension 34 of pMOS and the sources/drains 42, 242 of pMOS and nMOS are in the elevated structure, junction depths thereof can be effectively made shallower as compared with a flat structure, thereby enhancing efficiency of suppressing a short channel effect.

A manufacturing process of the semiconductor device of the embodiment will be described by using process sectional views of FIGS. 2A to 2H. The drawings show pMOS only which is a main object of the present invention. However, nMOS can be similarly manufactured only by making partial changes. Reference numerals corresponding to nMOS are given in ( ), and reference will be made to FIG. 1.

(1) First, an isolation 16 is being formed in a semiconductor substrate 10, e.g., a silicon substrate 10, and then a plurality of films for a gate electrode 24 (224) are being formed on an entire surface.

A well 14 (214) is formed in the silicon substrate 10 (see FIG. 1). The well is doped with n type impurities in a pMOS region 14, and with p type impurities in an nMOS region 214. In the process sectional view below, the well 14 is omitted.

Referring to FIG. 2A, the isolation 16 is formed. The isolation 16 can be so-called shallow trench isolation (STI) in which a shallow trench is formed in the silicon substrate 10, and the trench is filled with an insulator, e.g., silicon oxide ($SiO_2$) formed by chemical vapor deposition (CVD). Then, a gate insulator 22 (222) is formed on an entire surface. For the gate insulator, for example, $SiO_2$ film or a silicon oxynitride (SiON) film can be used. On the gate insulator 22 (222), a conductive film 24m which becomes the gate electrode 24 (224), e.g., a polycrystal silicon film 24*m* doped with a high concentration of phosphorus or boron, is deposited. A first insulator 26 is deposited on the polycrystal silicon film 24*m*. For the first insulator 26, for example, SiO$_2$ film formed by CVD can be used. The first insulator 26 is used as a hard mask when the gate electrode 24 (224) is processed in the next step.

(2) Next, as shown in FIG. 2B, the gate electrode 24 (224) is being processed.

A pattern of the gate electrode 24 (224) is formed on the first insulator 26 by lithography and etching. By using the first insulator 26 as a mask, the conductive film 24*m* for the gate electrode is etched to form the gate electrode 24 (224).

(3) Next, as shown in FIG. 2C, a first gate sidewall 28 (228) is being formed on a side face of the gate electrode 24 (224). Further, a surface of the silicon substrate 10 of pMOS region is being etched to form a shallow first trench 30 for forming a source/drain extension 34.

In this case, the silicon substrate 10 is thermally oxidized to form a thin oxide film (not shown) on an entire surface exposed. Then, a second insulator 28*m* which becomes a first gate sidewall 28 (228) is formed on an entire surface. For the second insulator, for example, a silicon nitride (SiN) film having a thickness of 10 nm can be used. The second insulator 28*m* on the silicon substrate 10 and a top surface of the gate electrode 24 (224) is removed by anisotropic etching, so that the second insulator 28*m* is left only on the side face of the gate electrode 24 (224). In other words, the first gate sidewall 28 (228) is formed.

Further, only in pMOS region, the silicon substrate 10 is etched by using the gate electrode 24 and the first gate sidewall 28 as masks to form a first trench 30 for forming SiGe, i.e., the source/drain extension 34.

Figure 2D:
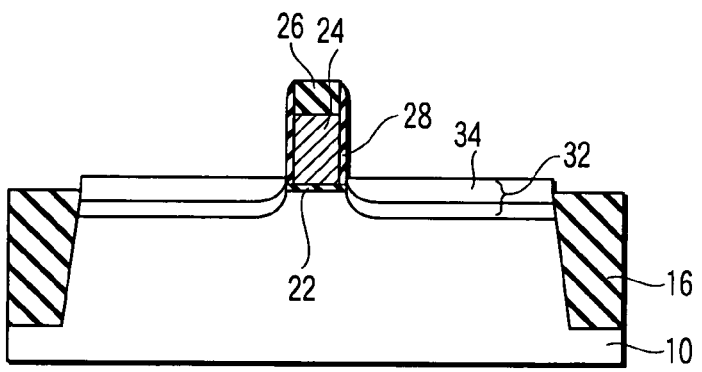

(4) Next, as shown in FIG. 2D, SiGe layer 32 is being formed only in pMOS region, and then source/drain extensions 34 (234) are being formed in both pMOS and nMOS.

In this case, SiGe layer 32 is selectively formed by, e.g., selective epitaxial growth, only on the first trench 30 in pMOS region formed in the previous step (3). The SiGe selective epitaxial growth can be carried out in hydrogen (H$_2$) as a carrier gas by adding about 0.4 to 0.5% of hydrogen chloride (HCl) and using a mixed gas of dichlorsilane (SiH$_2$Cl$_2$) and monogerman (GeH$_4$) as source materials at a temperature of, e.g., 650° C. to 750° C. A gas flow rate of GeH$_4$ with respect to SiH$_2$Cl$_2$ can be set to, e.g., 2% to 5%. By changing the gas flow ratio, a germanium concentration in the SiGe layer can be controlled to a desired amount. The germanium concentration in the SiGe layer 32 is in a range of, e.g., 10% to 30%. A thickness of the SiGe layer 32 can be changed depending on a gate length. For example, if the gate length is 70 nm, the thickness of the SiGe layer 32 can be set in a range of, e.g., 35 nm to 40 nm. However, by making the SiGe layer 32 thicker, it can be increased the compressive stress applied to the channel region.

In this embodiment, a surface of the SiGe layer 32 is set higher than that of the silicon substrate 10 of the channel region. For example, a depth of the first trench 30 for forming the SiGe layer is set to 30 nm, and a film thickness of the SiGe layer 32 is set to 40 nm. Thus, the SiGe layer 32 is formed into an elevated structure, the compressive stress can be generated in the channel region more efficiently than that in a flat structure.

Subsequently, doping of the source/drain extension 34 (234) is carried out by, e.g., ion implantation. Conditions of the ion implantation are with a lower energy and a lower concentration than those of ion implantation for a source/drain 42 (242) executed later. Accordingly, a junction depth of the source!drain extension 34 (234) can be set shallower than that of the source/drain 42 (242). As impurities being doped, for example, boron can be used in the SiGe layer 32 of pMOS region, and arsenic can be used in the silicon substrate 10 of nMOS region.

In the case of doping of the source/drain extension 34 of pMOS, for example, it can be simultaneously doped with boron during the selective epitaxial growth of the SiGe layer 32. In this case, the above mentioned ion implantation can be omitted in pMOS. By using such a doped SiGe layer 32, a junction depth of the source/drain extension 34 is set equal to a thickness of the SiGe layer 32, as in an example of FIG. 3 described later.

In the case of doping of the source/drain extension 34 by ion implantation, a junction depth can be controlled by adjusting implantation energy. For example, as shown in FIG. 2D, the junction depth of the source/drain extension 34 can be set shallower than the thickness of the SiGe layer 32. Moreover, as diffusion of boron in SiGe is suppressed against that in silicon, it is preferable for making shallower source/drain extension 34 junctions.

To suppress the short channel effect, preferably, the junction depth of the source/drain extension 34 should be shallow. And to improve carrier mobility in the channel region of pMOS, preferably, compressive stress should be high, i.e., the SiGe layer 32 should be thick. This structure can be realized by doping the source/drain extension 34 by ion implantation as described above, and setting the junction depth of the source/drain extension 34 shallower than the thickness of the SiGe layer 32.

Thus, as shown in FIG. 2D, in pMOS region, it can be formed the source/drain extension 34 with the elevated structure which uses the SiGe layer 32.

Figure 2E:
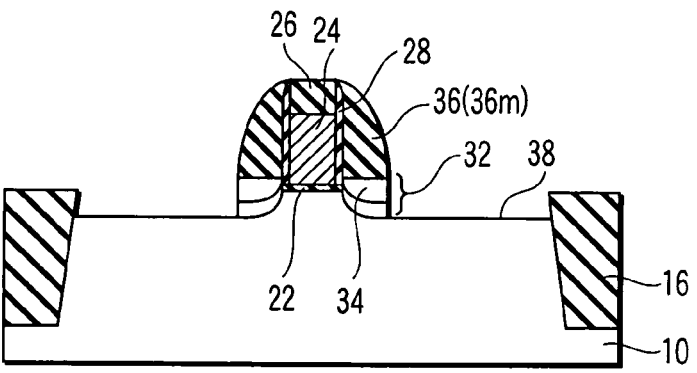

(5) Next, as shown in FIG. 2E, a second gate sidewall 36 (236) is being formed, and then a second trench 38 is being formed for forming the source/drain.

In this case, a third insulator 36*m* is deposited on an entire surface including on the gate electrode 24 (224). As the third insulator, for example, SiN film or SiO$_2$ film having a thickness of 20 to 30 nm formed by CVD can be used. The third insulator 36*m* on the gate electrode 24 (224) and on the SiGe layer 32 (pMOS region) or the silicon substrate 10 (nMOS region) is removed by anisotropic etching, so that the third insulator 36*m* is left only on the side face of the gate electrode 24 (224). Accordingly, a second gate sidewall 36 (236) can be formed.

Then, by using the gate electrode 24 (224) and the second gate sidewall 36 (236) as masks, the exposed SiGe layer 32 (in pMOS region) or silicon substrate 10 (in nMOS region) is etched to form the second trench 38 for forming the source/drain 42 (242). A depth of the second trench 38 can be set equal to the thickness of the SiGe layer 32 removed. During the etching, as an upper surface of the gate electrode 24 (224) is covered with the first insulator 26, the gate electrode 24 (224) is not etched.

Thus, it can be formed the structure shown in FIG. 2E in which the SiGe layer 32 is left only below the second gate sidewall 36 of pMOS, and the source/drain extension 34 (234) is formed below the second gate sidewall 36 (236).

Figure 2F:
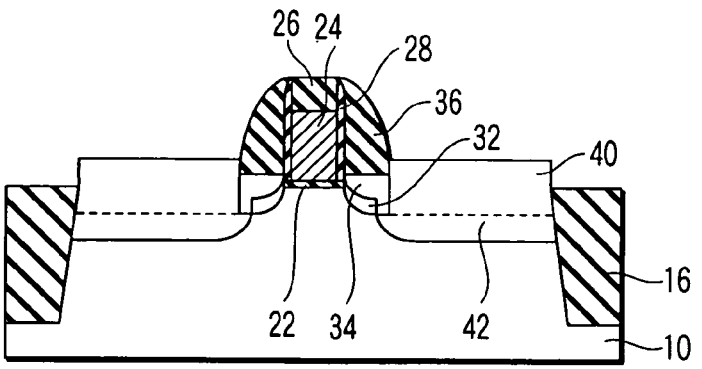

(6) Next, as shown in FIG. 2F, a silicon layer 40 (240) is being formed by selective epitaxial growth in the second trench 38 for forming the source/drain 42 (242).

As in the case of the selective epitaxial growth of the SiGe layer 32, the selective epitaxial growth of the silicon layer 40 (240) can be carried out, for example, in an H$_2$ gas as a carrier gas by adding a small amount of HCl and using monosilane (SiH$_4$) as a source gas. The silicon layer 40 (240) is set thicker than a depth of the second trench 38, i.e., the thickness of SiGe layer 32, so that the source/drain 42 (242) can be formed into an elevated structure in a subsequent step.

Then, to form the source/drain 42 (242), by using the gate electrode 24 (224) and the second sidewall 36 (236) as masks, for example, boron is ion-implanted in pMOS region, and arsenic is ion-implanted in nMOS region. The ion implantation conditions of the source/drain 42 (242) are higher in energy and higher in concentration than those of the source/drain extension 34 (234) in the step (4).

Accordingly, it can be formed the source/drain 42 (242) of the elevated structure shown in FIG. 2F.

Figure 2G:
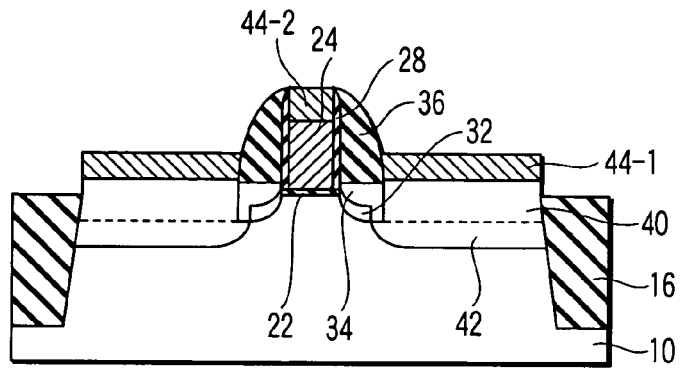

(7) Next, as shown in FIG. 2G, a silicide layer 44 is being formed on the source/drain 42 (242) and the gate electrode 24 (224).

Here, the first insulator 26 on the gate electrode 24 (224) is removed by, e.g., wet etching. Accordingly, silicon layer surface is exposed on the gate electrode 24 (224) and the source/drain 42 (242).

Then, a silicide metal (not shown) is deposited on an entire surface including the gate electrode 24 (224) by, e.g., sputtering. For the silicide metal, for example, nickel (Ni), cobalt (Co), or a high-melting point metal, such as titanium (Ti), iridium (Ir) or platinum (Pt), can be used. The silicide metal comes into contact with exposed surfaces of the silicon layer 42 (242) of the source/drain and the gate electrode 24 (224). Subsequently, a heat treatment is executed to react the silicide metal with the silicon, whereby a silicide layer 44-1 (244-1) is formed on the surface of the source/drain 42 (242) and a silicide layer 44-2 (244-2) is formed on the surface of the gate electrode 24 (224).

The source/drain 42 (242) for forming the silicide layer 44 (244) does not contain germanium. Thus, it can be prevented a deposition failure such as agglomeration of silicide metal (e.g., nickel) and/or peeling off of the silicide layer during its formation. By setting a germanium concentration in the silicon equal to or less than 10%, it can be prevented a deposition failure of the silicide layer.

Subsequently, by removing the unreacted silicide metal other than the silicide layer 44 (244), a structure shown in FIG. 2G can be completed.

For the formation of the silicide layer, in place of depositing the silicide metal, for example, the silicide layer can be directly deposited by cosputtering of simultaneously sputtering silicon and silicide metal.

Figure 2H:
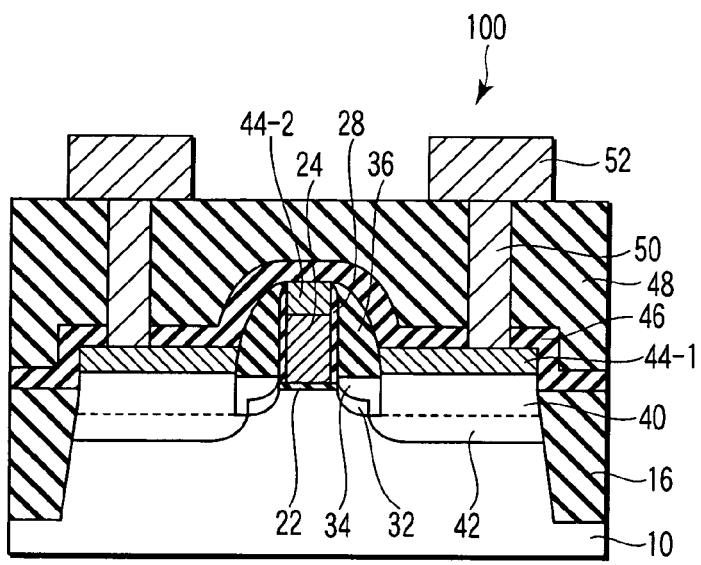

(8) Next, a wiring 52 (252) is being formed as shown in FIG. 2H.

In this case, a fourth insulator 46 is deposited on an entire surface, an interlevel insulator 48 is deposited on an entire surface, and then a surface is planarized by, e.g., chemical mechanical polishing (CMP). A contact hole 50*h* reaching the source/drain 42 (242) is formed in the interlevel insulator 48. A contact plug 50 (250) is formed in the contact hole 50*h*, and the wiring 52 (252) is formed to be connected to the contact plug 50 (250), thereby completing a structure shown in FIG. 2H.

Subsequently, steps such as multilevel wiring necessary for the semiconductor device are carried out to complete the semiconductor device which can use SiGe for the source/drain extension of pMOS and form the silicide layer on the source/drain, simultaneously, and realize a high-speed operation.

According to the embodiment, the SiGe layer 32 is formed only in the source/drain extension 34 of pMOS. Thus, the source/drain 42 (242) and the gate electrode 24 (224) for forming the silicide layer 44 (244) contain no germanium, or less germanium. To prevent the deposition failure of the silicide layer, preferably, a germanium concentration in silicon should be set equal to or less than 10%. Accordingly, it can be prevented a deposition failure such as agglomeration of silicide metal (e.g., nickel) and/or peeling off of the silicide layer during the formation of the silicide layer 44 (244).

Furthermore, the source/drain extension 34 of pMOS and the sources/drains 42 (242) of pMOS and nMOS are formed into elevated structures. Thus, junction depths thereof can be made substantially shallow. As a result, it can be effectively suppressed the short channel effect.

Various modifications can be made of the embodiment and implemented. Some modified examples will be described below.

Modified Example 1 of First Embodiment

Figure 3:
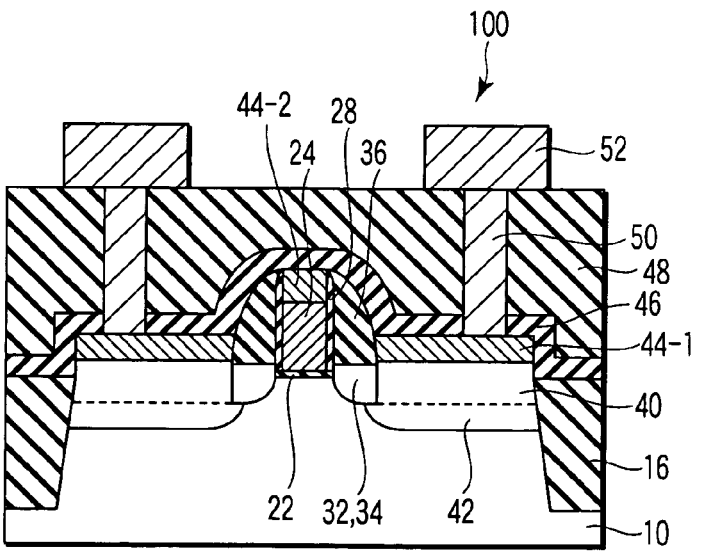
FIG. 3 is a sectional view illustrating a modified example of the semiconductor device of the first embodiment of the present invention.

FIG. 3 shows a modified example of the first embodiment. According to the modified example, doping of the source/drain extension 34 of pMOS is carried out by, for example, in situ doping boron in selective epitaxial growth of SiGe layer 32. By using the doped SiGe layer 32, the junction depth of the source/drain extension 34 is set equal to a thickness of the SiGe layer 32. In this case, in pMOS, it can be omitted the ion implantation carried out in the step (4) of the first embodiment to form the source/drain extension.

Modified Example 2 of First Embodiment

Figure 4:
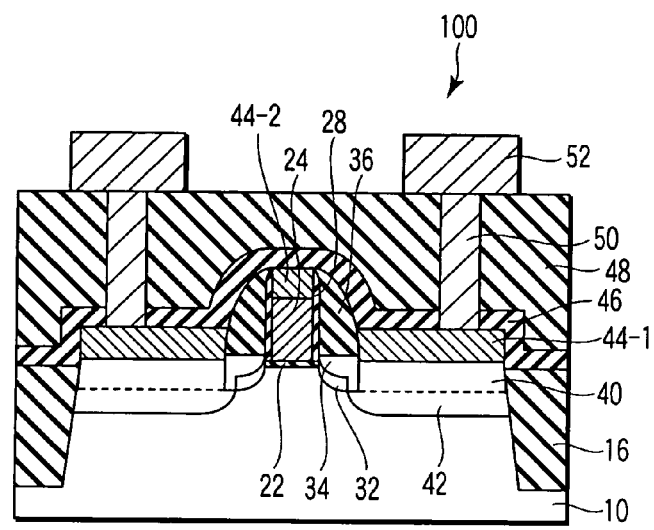
FIG. 4 is a sectional view illustrating another modified example of the semiconductor device of the first embodiment of the present invention.

FIG. 4 shows another modified example of the first embodiment. As described above with reference to FIG. 1, the first embodiment employs the structure in which the silicide layer 44-1 formed on the source/drain 42 of pMOS does not come into contact with the source/drain extension 34. However, as shown in FIG. 4, a structure can be employed in which a part of a silicide layer 44-1 comes into contact with a source/drain extension 34 by making the silicide layer 44-1 thick or the like.

Second Embodiment

Figure 5:
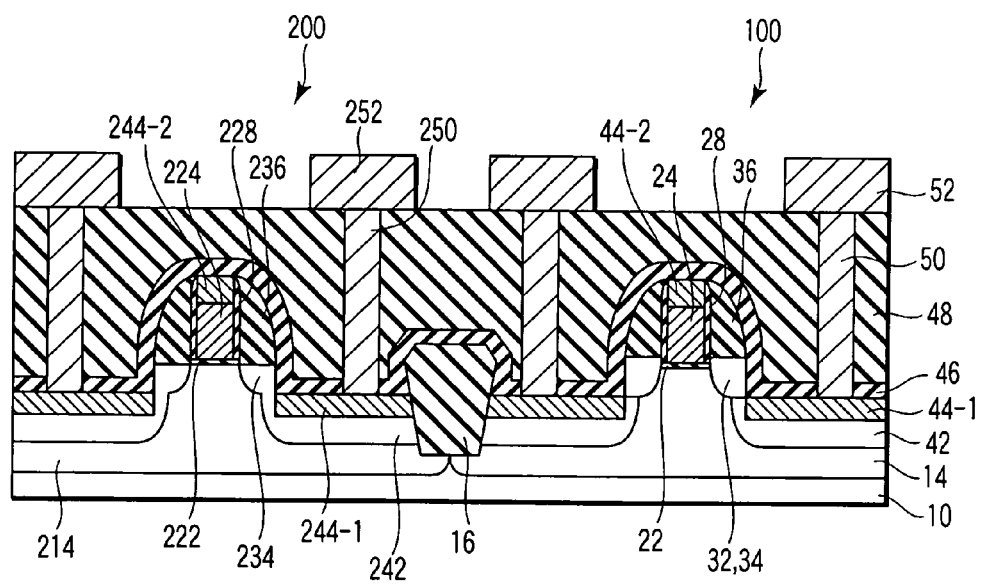
FIG. 5 is a sectional view illustrating an example of a semiconductor device according to a second embodiment of the present invention.

FIG. 5 shows an example of a sectional structure of a semiconductor device according to a second embodiment. The embodiment is a semiconductor device employing an elevated source/drain extension structure 34 in pMOS in which SiGe layer 32 is used, as in the case of the first embodiment. However, the semiconductor device employs a recessed source/drain structure 42, 242 in both pMOS and nMOS in which the sources/drains 42, 242 are formed into recessed shapes, that is, formed in the silicon substrate 10 with a lower level.

A manufacturing process of the semiconductor device of the embodiment will be described by referring process sectional views of FIGS. 6A to 6C. As in the case of the first embodiment, the drawings show pMOS only which is a main object of the present invention. However, nMOS can be similarly manufactured only by making partial changes. In the description below, reference numerals corresponding to nMOS are given in ( ), and reference will be made to FIG. 5.

(1) FIG. 6A is similar to FIG. 2E, illustrating a structure in which the source/drain extension 34 of pMOS is formed into the elevated structure using SiGe layer 32, a second gate sidewall 36 is formed, and a trench 38 for forming source/drain is formed.

If the source/drain extension 34 is formed by ion implantation as in the case of the first embodiment, diffusion of boron in the SiGe layer is suppressed as described above. According to the embodiment, to bring the source/drain extension 34 into contact with a source/drain 42, preferably, the source/drain extension 34 should be simultaneously doped with boron in a selective epitaxial growth of the SiGe layer 32 as a doped SiGe.

On the other hand, a source/drain extension 234 of nMOS is formed by, e.g., ion implantation, as in the case of the first embodiment.

After the formation of the source/drain extension 34 (234), a second gate sidewall 36 (236) is formed on a side face of a gate electrode 24 (224). Then, by using the gate electrode 24 (224) and the second gate sidewall 36 (236) as masks, the exposed SiGe layer 32 of pMOS and a silicon substrate 10 of nMOS are etched to form a trench 38 for forming a source/drain 42 (242). A depth of the trench 38 can be set equal to a thickness of the SiGe layer 32 removed.

(2) Next, as shown in FIG. 6B, the source/drain 42 (242) is being formed, and a silicide layer 44 (244) is being formed on the source/drain 42 (242) and the gate electrode 24 (224).

In this case, to form the source/drain 42 (242), the gate electrode 24 (224) and the second gate sidewall 36 (236) are used as masks, then, for example, boron is ion-implanted in pMOS region, and arsenic is ion-implanted in nMOS region. Ion implantation conditions of the source/drain 42 (242) are higher in energy and higher in concentration than those of the source/drain extension 34 (234).

Subsequently, the step (7) of the first embodiment is carried out. That is, the first insulator 26 on the gate electrode 24 (224) is removed by, e.g., wet etching. Then, a silicide metal (not shown) is deposited on an entire surface including the gate electrode 24 (224). Subsequently, a heat treatment is executed to react silicon with the silicide metal, whereby a silicide layer 44-1 (244-1) is formed on a surface of the source/drain 42 (242) and a silicide layer 44-2 (244-2) is formed on the gate electrode 24 (224). Then, an unreacted silicide metal other than the silicide layer 44 (244) is removed.

Thus, a structure shown in FIG. 6B is completed.

(3) Further, a wiring 52 (252) is being formed.

As shown in FIG. 6C, a fourth insulator 46 and an interlevel insulator 48 are deposited on an entire surface, and then the surface is planarized. A contact plug 50 (250) reaching the source/drain 42 (242) is formed in the interlevel insulator 48 and the fourth insulator 46. A wiring 52 (252) is formed to be connected to the contact plug 50 (250), thereby completing a structure shown in FIG. 6C.

According to the embodiment, the SiGe layer 32 is formed only in the source/drain extension 34 of pMOS. Thus, the source/drain 42 (242) and the gate electrode 24 (224) being formed the silicide layer 44 (244) contain no germanium or less germanium. Accordingly, it can be prevented a deposition failure such as agglomeration of silicide metal (e.g., nickel) and/or peeling off of the silicide layer during the formation of the silicide layer 44 (244).

Furthermore, the source/drain extension 34 of pMOS is formed into an elevated structure. Thus, a junction depth thereof can be made substantially shallow. As a result, it can be effectively suppressed the short channel effect.

Subsequently, steps such as multilevel wiring necessary for the semiconductor device are carried out to complete the semiconductor device which can use SiGe for the source/drain extension of pMOS and form the silicide layer on the source/drain, simultaneously, and realize a high-speed operation.

Third Embodiment

Figure 7:
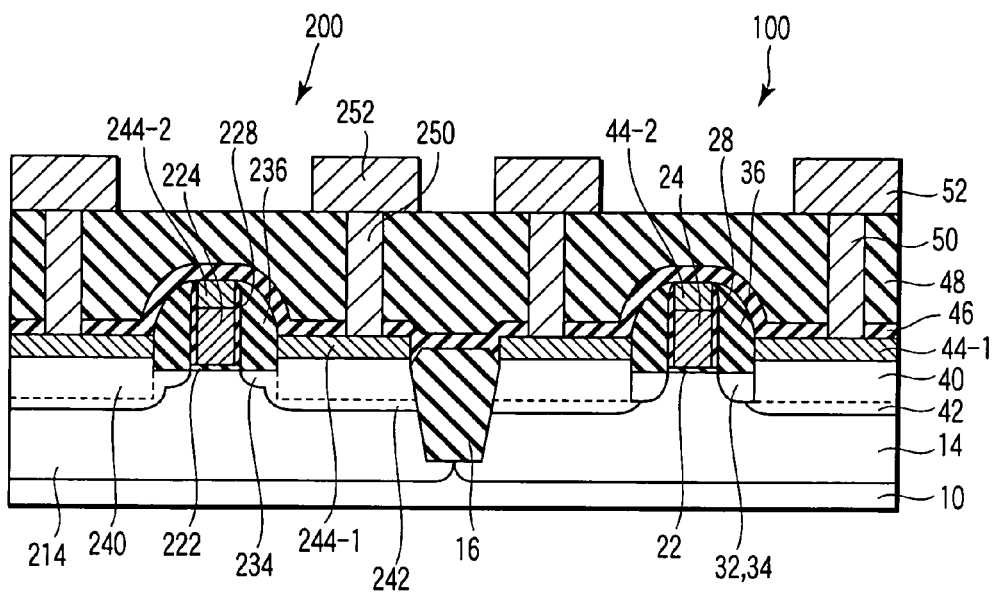
FIG. 7 is a sectional view illustrating an example of a semiconductor device according to a third embodiment of the present invention.

FIG. 7 shows an example of a sectional structure of a semiconductor device according to a third embodiment of the present invention. The embodiment is similar to the first embodiment, although sources/drains 42, 242 of pMOS and nMOS are formed into elevated structures and a source/drain extension 34 of a pMOS uses an SiGe layer 32, the source/drain extension 34 of pMOS is not formed in a elevated structure.

A manufacturing process of the embodiment is almost the same as that of the first embodiment except for the SiGe layer 32 is thin, and thus detailed description thereof will be omitted. That is, a surface of the SiGe layer 32 is formed to be nearly equal to a height of a surface of an adjacent channel region of a silicon substrate 10.

According to the embodiment, the SiGe layer 32 is formed only in the source/drain extension 34 of pMOS. Thus, a source/drain 42 (242) and a gate electrode 24 (224) for forming a silicide layer 44 (244) contain no germanium, or less germanium. As a result, it can be prevented a deposition failure such as agglomeration of silicide metal (e.g., nickel) and/or peeling off of the silicide layer during formation of the silicide layer 44 (244).

Fourth Embodiment

Figure 8:
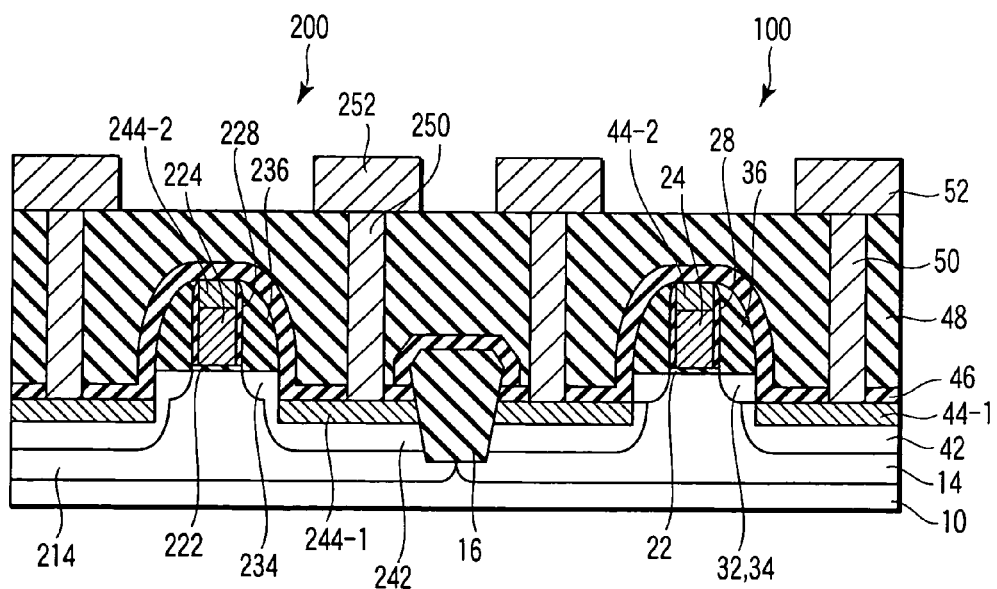
FIG. 8 is a sectional view illustrating an example of a semiconductor device according to a fourth embodiment of the present invention.

FIG. 8 shows an example of a sectional structure of a semiconductor device according to a fourth embodiment of the present invention. The embodiment is similar to the second embodiment, a source/drain extension 34 of a pMOS uses an SiGe layer 32 but is not formed into an elevated structure, and sources/drains 42, 242 are formed into recessed structures.

A manufacturing process of the embodiment is almost the same as that of the second embodiment except for the SiGe layer 32 is thin, and thus detailed description thereof will be omitted. That is, a surface of the SiGe layer 32 is formed to be nearly equal to a height of a surface of an adjacent channel region of a silicon substrate 10.

According to the embodiment, the SiGe layer 32 is formed only in the source/drain extension 34 of pMOS. Thus, a source/drain 42 (242) and a gate electrode 24 (224) for forming a silicide layer 44 (244) contain no germanium, or less germanium. As a result, it can be prevented a deposition failure such as agglomeration of silicide metal (e.g., nickel) and/or peeling off of the silicide layer during formation of the silicide layer 44 (244).

FIGS. 9A, 9B show results of simulating stress applied to the channel region of pMOS in the semiconductor device of the present invention. FIG. 9A is an equal stress diagram showing a stress distribution in a silicon substrate around a source/drain extension formed by using an SiGe layer. A MOSFET used in the simulation has a recessed source/drain as in the case of pMOS of the fourth embodiment. However, in the simulation, for the sake of simplicity, effects of impurities doped to the source/drain extension and the source/drain and a silicide layer are not taken into account.

FIG. 9A shows an equal stress line superimposed on a sectional view of the MOSFET in which a boundary at an edge of the gate electrode and the silicon substrate is an original point. The SiGe layer used here has a width of 70 nm, a thickness of 20 nm, and a germanium concentration of 20%. Numerals in the drawing indicate stress values: a positive value indicating tensile stress, and a negative value indicating compressive stress.

As apparent from the drawing, compressive stress is induced in the silicon substrate outside the SiGe layer, and tensile stress is induced in the silicon substrate directly below the SiGe layer. It can be understood that, around the SiGe layer, larger compressive stress is induced nearer the SiGe layer and nearer a silicon surface. Additionally, compressive stress becomes a maximum in the silicon substrate just below the gate electrode, i.e., the channel region, contacting with the SiGe layer.

Thus, it is proved that the structure of the present invention can effectively apply compressive stress to the channel region of pMOS.

FIG. 9B shows a result of stress obtained at a place in the silicon substrate of 2 nm below the gate electrode by changing the width of the SiGe layer. Even when the MOSFET is miniaturized to reduce the width of the SiGe layer to, e.g., 20 nm, compressive stress can be applied to the channel region according to the present invention. By setting the SiGe layer thicker, it can be applied larger stress to the channel region even in the same SiGe layer width (not shown).

According to the present invention, the SiGe layer is formed only in the source/drain extension of pMOS. Thus, a source/drain and a gate electrode for forming a silicide layer contain no germanium, or less germanium. To prevent the deposition failure of the silicide layer, preferably, a germanium concentration in silicon should be set equal to or less than 10%. Therefore, it can be prevented a deposition failure such as agglomeration of silicide metal (e.g., nickel) and/or peeling off of the silicide layer during formation of the silicide layer.

Moreover, if the source/drain extension and the source/drain are formed into elevated structures, a junction depth thereof can be substantially made shallow. Additionally, the source/drain extension with a shallow junction depth can be efficiently formed since diffusion of boron in the SiGe layer is suppressed. As a result, it can be reduced parasitic resistance and effectively suppressed a short channel effect in a fine MOSFET.

The device structure of the present invention can be formed without any additional manufacturing steps in any embodiments, and only by increasing over-etching amount of the silicon substrate and/or the SiGe layer after a gate sidewall is formed.

As described above, according to the present invention, it can be provided a semiconductor device which can use SiGe for the source/drain extension of pMOS and form the silicide layer on the source/drain, simultaneously, and realize a high-speed operation, and its manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a gate electrode formed in a first conductive type region of a silicon semiconductor substrate via an insulator;
    a first sidewall formed on a side face of the gate electrode;
    a second sidewall formed on a side face of the first sidewall;
    a semiconductor layer formed below the second sidewall, including a first impurity layer of a second conductive type and containing germanium, and having substantially the same width as that of the second sidewall;
    a second impurity layer formed in a region outside the second sidewall and containing impurities of the second conductive type with a higher concentration than those in the first impurity layer; and
    a silicide layer formed on the second impurity layer.

2. The semiconductor device according to claim 1, wherein a surface of the semiconductor layer is positioned at a higher level than that of a surface of the semiconductor substrate.

3. The semiconductor device according to claim 2, wherein a surface of the second impurity layer is positioned in a different level from the surface of the semiconductor substrate.

4. The semiconductor device according to claim 1, wherein a germanium concentration in the second impurity layer is equal to or less than 10%.

5. The semiconductor device according to claim 1, wherein the semiconductor layer contains silicon germanium.

6. The semiconductor device according to claim 1, wherein the first conductive type is n-type and the second conductive type is p-type.

7. The semiconductor device according to claim 1, wherein the second impurity layer has a lower germanium concentration than the semiconductor layer.

8. The semiconductor device according to claim 7, wherein a surface of the semiconductor layer is positioned at a higher level than that of a surface of the semiconductor substrate.

9. The semiconductor device according to claim 8, wherein a surface of the second impurity layer is positioned in a different level from the surface of the semiconductor substrate.

10. The semiconductor device according to claim 7, wherein a germanium concentration in the second impurity layer is equal to or less than 10%.

11. The semiconductor device according to claim 7, wherein the semiconductor layer contains silicon germanium.

12. The semiconductor device according to claim 1, wherein the second sidewall has a width greater than the first sidewall.

13. The semiconductor device according to claim 1, wherein a surface of the semiconductor layer is positioned at a higher level than that of a surface of the semiconductor substrate, a germanium concentration in the second impurity layer is equal to or less than 10%, wherein the semiconductor layer contains silicon germanium, and the first conductive type is n-type and the second conductive type is p-type.

14. A semiconductor device comprising first and second semiconductor elements, wherein:
    the first semiconductor element comprising:
    a first gate electrode formed in a first conductive type region of a silicon semiconductor substrate via an insulator;
    a first sidewall formed on a side face of the first gate electrode;
    a second sidewall formed on a side face of the first sidewall;
    a semiconductor layer formed below the second sidewall, including a first impurity layer of a second conductive type and containing germanium, and having substantially the same width as that of the second sidewall;

a second impurity layer formed in a region outside the second sidewall and containing impurities of the second conductive type with a higher concentration than those in the first impurity layer; and a first silicide layer formed on the second impurity layer; and the second semiconductor element comprising:

a second gate electrode formed in a second conductive type region of the semiconductor substrate via an insulator;

a third sidewall formed on a side face of the second gate electrode;

a fourth sidewall formed on a side face of the third sidewall;

a third impurity layer of a first conductive type formed in the semiconductor substrate below the sidewall of the fourth sidewall;

a fourth impurity layer formed in a region outside the fourth sidewall and containing impurities of a first conductive type with a higher concentration than those in the third impurity layer; and a second silicide layer formed on the fourth impurity layer.

15. The semiconductor device according to claim 14, wherein a surface of the semiconductor layer is positioned at a higher level than that of a surface of the semiconductor substrate.

16. The semiconductor device according to claim 14, wherein a germanium concentration in the second impurity layer is equal to or less than 10%.

17. The semiconductor device according to claim 14, wherein the semiconductor layer contains silicon germanium.

18. The semiconductor device according to claim 14, wherein the first conductive type is n-type and the second conductive type is p-type.

19. The semiconductor device according to claim 14, wherein the second impurity layer has a lower germanium concentration than the semiconductor layer.

20. The semiconductor device according to claim 19, wherein a surface of the semiconductor layer is positioned at a higher level than that of a surface of the semiconductor substrate.

21. The semiconductor device according to claim 19, wherein a germanium concentration in the second impurity layer is equal to or less than 10%.

22. The semiconductor device according to claim 19, wherein the semiconductor layer contains silicon germanium.

23. The semiconductor device according to claim 14, wherein the second sidewall has a width greater than the first sidewall.

24. The semiconductor device according to claim 14, wherein a surface of the semiconductor layer is positioned at a higher level than that of a surface of the semiconductor substrate, a germanium concentration in the second impurity layer is equal to or less than 10%, wherein the semiconductor layer contains silicon germanium, and the first conductive type is n-type and the second conductive type is p-type.

* * * * *